(12) United States Patent
Stark

(10) Patent No.: US 6,757,780 B2
(45) Date of Patent: Jun. 29, 2004

(54) MULTIPLE MODULE CONTENT ADDRESSABLE MEMORIES

(75) Inventor: Moshe Stark, Even Yehuda (IL)

(73) Assignee: Hywire Ltd., Netany (IL)

( * ) Notice: Subject to any disclaimer, the term of this patent is extended or adjusted under 35 U.S.C. 154(b) by 249 days.

(21) Appl. No.: 10/040,389

(22) Filed: Jan. 9, 2002

(65) Prior Publication Data

US 2003/0131187 A1 Jul. 10, 2003

(51) Int. Cl.[7] .............................................. G06F 12/00
(52) U.S. Cl. ...................................... 711/108; 365/49
(58) Field of Search ........................... 711/108; 365/49; 707/2, 201

(56) References Cited

U.S. PATENT DOCUMENTS

| | | | | |
|---|---|---|---|---|
| 4,967,341 A | * | 10/1990 | Yamamoto et al. | 707/2 |
| 5,920,886 A | * | 7/1999 | Feldmeier | 711/108 |
| 6,237,061 B1 | * | 5/2001 | Srinivasan et al. | 711/108 |
| 6,389,507 B1 | * | 5/2002 | Sherman | 711/108 |
| 6,415,279 B1 | * | 7/2002 | Gard et al. | 707/2 |
| 6,438,562 B1 | * | 8/2002 | Gupta et al. | 707/201 |
| 6,606,681 B1 | * | 8/2003 | Uzun | 711/108 |

* cited by examiner

Primary Examiner—Nasser Moazzami
(74) Attorney, Agent, or Firm—Mark M. Friedman

(57) ABSTRACT

A method and device for arranging and storing data in a memory and for extracting the data from the memory in response to an input key, the method including the steps of: (a) providing a device including: (i) a memory having a plurality of module pairs, each of the module pairs having: (A) a key module including a first array of cells, the first array having at least two dimensions and having rows and columns, the first array containing a plurality of keys, each of the cells having a unique address and being accessible via an input key, the keys within each of the key modules being arranged in monotonic order, and (B) an associated data module including a second array of cells, the second array having at least two dimensions and having rows and columns, the second array having a plurality of data entries, associated with the keys, wherein the memory is designed and configured such that each of the data entries is associated with a particular one of the keys, and (ii) processing means, and (b) performing a processing operation, using the processing means on each the key module in parallel.

43 Claims, 12 Drawing Sheets

Figure 1

MULTIPLE MODULE CONTENT ADDRESSABLE MEMORIES

FIELD AND BACKGROUND OF THE INVENTION

The present invention relates to the field of Content Addressable Memory (CAM) and, more particularly, to a system for, and method of, implementing a RAM-Based Binary CAM and a RAM-Based Range Content Addressable Memory (RCAM).

Conventional memory arrays such as Random Access Memories (RAMs) store and retrieve data units indexed by their address.

Content Addressable Memories (CAMs) are associative memories that contain Key Entries and Associated Data Entries that uniquely correspond to the Key Entries. A CAM stores the key entries and the associated data entries at any available location and retrieves the Associated Data for any key that is submitted to be searched in the CAM.

A Binary CAM stores an ordered list of single integer key entries and a corresponding list of their associated data. An RCAM stores instead a list of key entries that represent range boundaries and a list of associated data that correspond uniquely to these ranges. A key search in a Binary CAM results in an exact match, whereas a key search in an RCAM matches an entire range. The RCAM also stores a list of associated boundary type entries that determine the validity of the corresponding ranges. This list can be stored in conjunction with the list of associated data or in a separate array.

A successful approach to utilizing RAM-based technology on a binary CAM is provided in my co-pending, unpublished (and as such, is not to be construed as prior art with regard to the present application) PCT Patent Application Serial No. IL01/00458, which is incorporated by reference for all purposes as if fully set forth herein. A method and apparatus are disclosed therein for the high-rate arrangement, storage and extraction of data in a two-dimensional memory array. The two-dimensional array, which consists of memory cells, is arranged in rows and columns, each of the key entries in these cells having a unique pair of indices that indicate the key entry location in the array. The associated data entries that correspond to these key entries are stored in another two-dimensional array under the same pair of indices. When a submitted key is searched and found, the associated data is retrieved from the corresponding cell in the other two-dimensional associated-data memory array and a match signal, "True" or "False", is also output with the retrieved associated data entry to indicate whether the associated data is valid or not. The key entries in the two-dimensional array are arranged, each entry in a separate cell, in rows or columns, in a subsequent ascending or descending order. The entries are arranged in the array so that at least a portion of the array is filled without blanks with valid entries. The arrays of the key entries and their associated data are kept in perfect sequence by Insert and Remove algorithms.

The main innovations introduced by this technology include:

Surrounding the RAM structure with search logic in the RAM periphery: The number of comparator units is proportional to the RAM periphery length rather than to the RAM area. This results in dramatic savings in the amount of comparator logic, while keeping the memory cell extremely efficient in density and speed. The CAM implementation overhead is typically less than 15%. Therefore, the CAM density obtained with this method is asymptotically close to the comparable size in RAM technology.

Fast Search Algorithm: The surrounding logic in conjunction with the RAM structure performs searches with the same throughput as a comparable RAM, and twice the latency. (Theoretically, single clock latency may be accomplished, but pipelining may yield a better throughput and a similar latency if measured on absolute time scale (nano-seconds).

Continuous "Housekeeping" Procedure: Unlike CAMs of the prior art, these CAM devices keep the "house in order". That is, the deletion of keys does not leave "holes" in the list, which would otherwise require "housekeeping" operations on the managing processor section. Similarly, the addition of new keys keeps the list in a perfect sequence. This "housekeeping" procedure takes longer than the search, but is much faster than required by the system. The overhead associated with the Key List update is significantly shorter when compared with the time taken by the processor to do the housekeeping. This superior performance is due to the efficient RAM and Insert/Remove hardware architecture, which execute very time-efficient algorithms.

In my co-pending, unpublished (and as such, is not to be construed as prior art with regard to the present application) PCT Patent Application Serial No. IL01/00595, which is incorporated by reference for all purposes as if fully set forth herein, a method and apparatus are disclosed for arranging and storing a set of key entries and a corresponding set of associated data entries in storage areas within a memory device. Each location in the first storage area is assigned a unique index and is associated with the corresponding location to second storage area with the same index. Each key entry represents a range of consecutive values and is denoted herein as Range Key Entry. The range may be represented by its lower or upper boundary.

When a key is submitted for search and is found to belong to a range represented by a range key entry, the associated data entry with the same index is extracted from the memory as valid data and a Match signal is issued. If no range is found to contain the submitted key, no valid associated data is retrieved and a No-Match signal is issued.

A successful approach to utilizing RAM-based technology on an RCAM in a similar way that on a binary CAM is provided in my co-pending, unpublished (and as such, is not to be construed as prior art with regard to the present application) PCT Patent Application Serial No. IL01/01025, which is incorporated by reference for all purposes as if fully set forth herein. A method and apparatus are disclosed therein for the high-rate arrangement, storage of ranges of integers and extraction of data associated with these ranges in a two-dimensional memory array. The two-dimensional array, which consists of memory cells, is arranged in rows and columns, each of the key entries (representing range boundaries) in these cells having a unique pair of indices that indicate the key entry location in the array. The associated data entries that correspond uniquely to these ranges are stored in another two-dimensional array under the same pair of indices. When a submitted key is searched and found within an integer range, the associated data is retrieved from the corresponding cell in the other two-dimensional associated-data memory array.

The RCAM includes a third two-dimensional array, consisting of associated boundary type entries that also correspond uniquely to these ranges and are stored under the same pair of indices; these entries determine the validity of the corresponding ranges. A match signal, "True" or "False", is output accordingly with the retrieved associated data entry to indicate whether the matched range and the associated data are valid or not. The array of associated boundary type entries can be stored in conjunction with that of associated data entries or separately.

The key entries in the two-dimensional array are arranged, each entry in a separate cell, in rows or columns, in a subsequent ascending or descending order. The entries are arranged in the array so that at least a portion of the array is filled without blanks with valid entries.

In many cases, the relatively slow speed of the Insert and Remove operations hampers the performance of the system. It would, therefore, be highly advantageous to have a system for, and a method of significantly improving the speed of the Insert and Remove algorithms, while maintaining the arrays of the key entries and their associated data in perfect sequence.

SUMMARY OF THE INVENTION

The present invention relates to a device for binary CAMs and for RCAMs having multiple module content addressable memories, and a method of utilizing the device.

According to the teachings of the present invention there is provided, a method for arranging and storing data in a memory and for extracting the data from the memory in response to an input key, the method including the steps of: (a) providing a device including: (i) a memory having a plurality of module pairs, each of the module pairs having: (A) a key module including a first array of cells, the first array having at least two dimensions and having rows and columns, the first array containing a plurality of keys, each of the cells having a unique address and being accessible via an input key, the keys being arranged in monotonic order, and (B) an associated data module including a second array of cells, the second array having at least two dimensions and having rows and columns, the second array having a plurality of data entries, associated with the keys, wherein the memory is designed and configured such that each of the data entries is associated with a particular one of the keys, and (ii) processing means, and (b) performing a processing operation, using the processing means on each key module in parallel.

According to yet another aspect of the present invention there is provided a multiple module device for storing arranged data in a memory, and for extracting the data therefrom, the device including: (a) a memory having a plurality of module pairs, each of the module pairs having: (i) a key module including a first array of cells, the first array having at least two dimensions and having rows and columns, the first array containing a plurality of keys, each of the cells having a unique address and being accessible via an input key, the keys within each of the key modules being arranged in monotonic order, and (ii) an associated data module including a second array of cells, the second array having at least two dimensions and having rows and columns, the second array having a plurality of data entries, associated with the keys, wherein the memory is designed and configured such that each of the data entries is associated with a particular one of the keys, and (b) processing means designed and configured to search, in response to the input key, the plurality of keys within each key module, so as to identify a match.

According to further features in the described preferred embodiments, the keys within each key module define a module value span, and the first modules are arranged in monotonic order with respect to each module value span.

According to still further features in the described preferred embodiments, the multiple module device further includes: (c) sorting means for arranging the keys in monotonic order within the first array.

According to still further features in the described preferred embodiments, the memory includes a memory selected from the group of memories consisting of: SRAM, DRAM, CCD, ROM, EPROM, $E^2$PROM, Flash-memory, and Magnetic-media.

According to still further features in the described preferred embodiments, the memory is a random access memory (RAM).

According to still further features in the described preferred embodiments, each of the associated data entries has a unique pair of row and column indices for association with a unique pair of row and column indices of a particular one of the keys.

According to still further features in the described preferred embodiments, the keys represent range boundary information.

According to still further features in the described preferred embodiments, the multiple module device further includes range validity information for each of the range boundary information, the range validity information stored within the memory.

According to still further features in the described preferred embodiments, the range boundary information is a single range-boundary value.

According to still further features in the described preferred embodiments, the range validity information is disposed in the first array, each range validity information corresponding to a particular single range-boundary value.

According to still further features in the described preferred embodiments, the range validity information is stored in a separate array.

According to still further features in the described preferred embodiments, the range validity information is disposed in the second array, each range validity information corresponding to a particular one of the associated data entries.

According to still further features in the described preferred embodiments, each key module includes a first register for holding a first key and a second register for holding a last key, the first key and the last key representing extreme values of the module value span, wherein the first register and the second register are designed and configured to produce register output signals.

According to still further features in the described preferred embodiments, each key module includes at least one comparator for comparing an index of a key having an extreme value of the module value span with an index of a key disposed in a last position of the key module.

According to still further features in the described preferred embodiments, the processing means include: i) a row locator containing at least a first comparator, for comparing contents of an end column of the first array with the input key.

According to still further features in the described preferred embodiments, the processing means further include: ii) a column locator containing at least a second comparator, for comparing contents of the row with the input key.

According to still further features in the described preferred embodiments, each of the module pairs further includes: (iii) a tristate buffer operatively connected to the key module and to the associated data module.

According to still further features in the described preferred embodiments, each of the module pairs further includes an associated boundary type module.

According to still further features in the described preferred embodiments, the associated boundary type module is operatively connected to a tristate buffer.

According to still further features in the described preferred embodiments, the output of the tristate buffer is enabled by a match signal received from the key module.

According to still further features in the described preferred embodiments, the device further includes an associated boundary type module including a third array of cells, the third array having at least two dimensions, and a plurality of data entries containing range validity information, each of the data entries associated with a particular one of the keys.

According to still further features in the described preferred embodiments, the processing operation includes a Search operation.

According to still further features in the described preferred embodiments, the processing operation includes an Insert operation.

According to still further features in the described preferred embodiments, the processing operation includes a Remove operation.

According to still further features in the described preferred embodiments, the processing operation includes an Update operation.

According to still further features in the described preferred embodiments, the processing operation includes a comparing operation.

According to still further features in the described preferred embodiments, the plurality of keys includes range boundary information, and the comparing operation includes comparing a value of the input key with the range boundary information to determine a particular range to which the input key belongs.

According to still further features in the described preferred embodiments, a row or column containing the range boundary information is selected by the following steps: (i) performing a comparison between the range boundary information and the input key to produce a result, and (ii) identifying a row or column in which the result undergoes a change in inequality status.

According to still further features in the described preferred embodiments, the method further includes the step of: (iii) selecting the row or column.

According to still further features in the described preferred embodiments, the method further includes the steps of: (c) identifying within a particular key module, a row into which a new key should be inserted and selecting the row, and (d) inserting the new key into an insertion location in the particular key module while maintaining the monotonic order within each of the key modules.

According to still further features in the described preferred embodiments, the identifying in step (c) includes a comparison of the new key with at least one end key of the plurality of keys, the end key disposed in an end column in the particular key module.

According to still further features in the described preferred embodiments, the identifying in step (c) includes examining all the key modules in parallel.

According to still further features in the described preferred embodiments, the method further includes the step of: (e) checking, before step (d), that the particular key module is devoid of a key of identical value to the new key.

According to still further features in the described preferred embodiments, the method further includes the step of: (e) identifying a column index for the new range boundary value by performing a comparison of the new range boundary value with the range boundary information disposed in the row.

According to still further features in the described preferred embodiments, the maintaining of the monotonic order is achieved by shifting a content of each cell disposed after the insertion location respectively, by one position, thereby completely filling at least a portion of the first array with the keys.

According to still further features in the described preferred embodiments, the data associated with the new key is inserted into the associated data module of the module pair containing the particular key module.

According to still further features in the described preferred embodiments, the method further includes the steps of: (c) identifying within a particular key module of the key modules, a row containing a key for removing, and selecting the row, and (d) removing the requisite key from a removal location in the particular key module while maintaining monotonic order within each of the key modules.

According to still further features in the described preferred embodiments, the method further includes the steps of: (c) identifying within a particular key module, a key that needs to be removed, and selecting the row, and (d) removing this key from a removal location in the particular key module while maintaining monotonic order within each of the key modules.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 1 is a schematic illustration of a 2-Dimensional M-column by N-row memory array;

DESCRIPTION OF THE PREFERRED EMBODIMENTS

Figure 2:
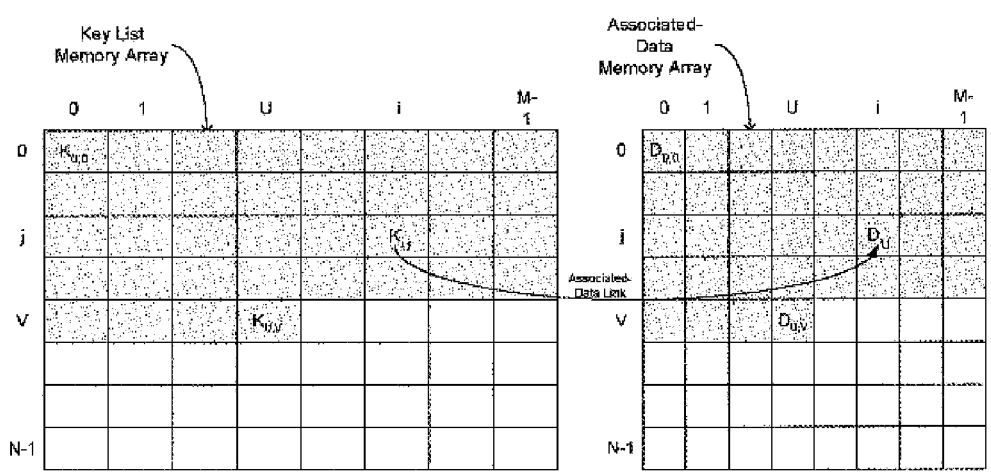
FIG. 2 is a schematic illustration of the correspondence between the 2-Dimensional key list and the associated data list for a binary CAM.

The present invention relates to a device for binary CAMs and for RCAMs having multiple module content addressable memories, and a method of utilizing the device.

The principles and operation of the multiple module content addressable memories of the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawing. The invention is capable of other embodiments or of being practiced or carried out in various ways. Also, it is to be understood that the phraseology and terminology employed herein is for the purpose of description and should not be regarded as limiting.

In my co-pending, unpublished PCT Patent Application Serial No. IL01/00458 and in my co-pending, unpublished PCT Patent Application Serial No. IL01/01025, methods are described for implementing a Binary CAM and an RCAM, respectively, using a RAM structure surrounded by search logic in the RAM periphery. The above-referenced applications also teach the running of a fast Search algorithm, and the maintaining of key lists and their associated data in perfect sequence by efficient Insert and Remove algorithms.

The multiple module implementations of the present invention are based on a method of interconnection of multiple Binary CAM or RCAM modules into a single Binary CAM or RCAM device, respectively. This method allows the division of the Binary CAM or RCAM structure into partial modules, each containing a small number of rows. As described hereinbelow, the Insert and Remove throughputs are inversely proportional to the number of rows in the CAM or RCAM. Thus, the use of the smaller partial modules significantly speeds up the Insert and Remove operations in these devices.

The main concepts and principles of operation of the RAM-Based RCAM are very similar to those of the RAM-Based Binary CAM. The main difference is that whereas the Binary CAM stores an ordered list of single integer keys and a corresponding list containing associated data, the RCAM stores a list of key entries that represent boundaries of associative ranges and a list containing associated data that correspond uniquely to these ranges. A key search in a Binary CAM results in an exact match, whereas a key search in an RCAM matches an entire range.

The RCAM also stores a list of associated boundary type entries that determine the validity of the corresponding ranges. This list can be stored in conjunction with the list of associated data or in a separate array.

Another difference between the Binary CAM and the RCAM is reflected in different (although quite similar) Search procedures for the two devices, which yield similar throughput performance. The Insert and Remove operations are practically identical for both devices. Thus, concerning the efficiency of operation and throughput, there are no basic differences between the two devices, and whatever is written below for the RAM-Based Binary CAM holds for the RAM-Based RCAM, unless indicated otherwise.

Throughput Considerations

It was demonstrated in my co-pending, unpublished (and as such, is not to be construed as prior art with regard to the present application) PCT Patent Application Serial No. IL01/00458 that the Search throughput is independent of the Binary CAM dimensions and is given by the following formula:

$$f_S = \frac{1}{T}$$

where $f_S$ is the search throughput, and

T is the clock cycle time.

The above-mentioned patent application also discloses a method for quick insertion and removal of keys and their associated data from the CAM. It was shown therein that the Insert and Remove operations require a time of approximately:

$$t_E = t_R \approx 2 \cdot (N+1) \cdot T + t_S,$$

where $t_E$ is the Insert time, $t_R$ is the Remove time, $t_S$ is the Search time for Insert or Remove operations, N is the number of rows in a block.

For a large number of rows, N>>1, and a relatively short Search time compared to the Insert or Remove time, $2 \cdot (N+1) \cdot T >> t_S$, the above formula becomes:

$$f_E = f_R \cong \frac{1}{2 \cdot N} \cdot f_S$$

This formula demonstrates that although the Search throughput is independent of the Binary CAM dimensions, the Insert and Remove throughputs are inversely proportional to the number of rows in the CAM.

Although the search speed is the most important parameter, it is clear that the speed performance in the insertion and removal of keys and associated data in the Binary CAM (plus associated boundary type entries in the RCAM) becomes the limiting factor for large CAM configurations.

The invention disclosed herein is designed to speed up the Insert and Remove operations. This is achieved by breaking down the Binary CAM (or RCAM) structure into smaller modules, each containing a small number of rows. These modules are integrated to form the Key List and Associated Data List (along with the Associated Boundary Type List in the RCAM).

Since all the modules perform Insert or Remove operations simultaneously, the time required to perform an Insert or Remove operation in a Binary CAM (or RCAM) is the same as that required for a single module, so it is determined by the number of rows in a module rather than the total number of rows in the Binary CAM (or RCAM).

Figure 1:
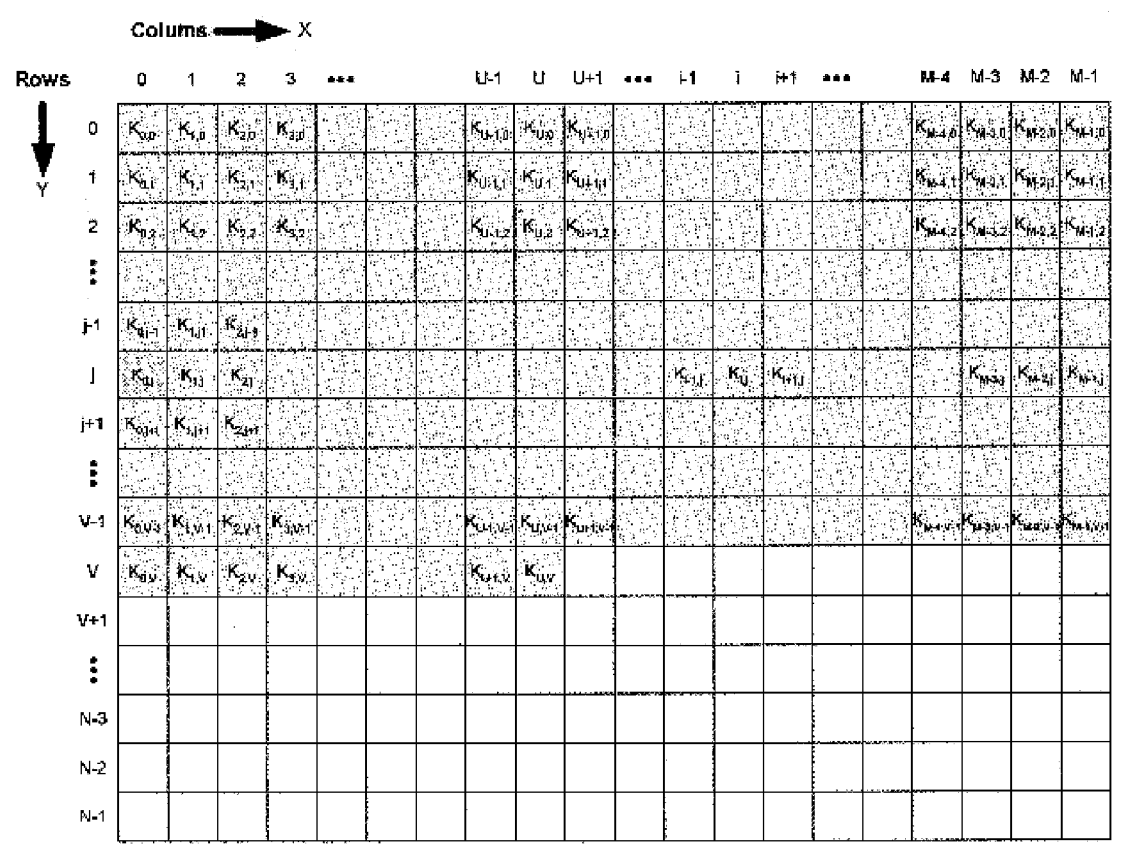

FIG. 1 depicts a TDA composed of M columns by N rows. The rows are sequenced from top to bottom and indexed with an integer index j, where $0 \leq j \leq N-1$. The columns are sequenced from left to right and indexed with an integer index i, where $0 \leq i \leq M-1$. The occupied key entry locations are shadowed with light gray. The empty locations are blank. A key located in column i and row j has an integer value $K_{i,j}$. The lowest key value $K_{0,0}$ resides in row 0 and column 0. The highest key value $K_{U,V}$ resides in row V and column U.

The RAM-Based Binary CAM contains two TDAs or lists, Key List and Associated Data List. Each key entry $K_{i,j}$ has a corresponding Associated Data entry $D_{i,j}$ as depicted in FIG. 2. Since the Binary CAM stores an ordered list of single integer keys, a successful key search results in an exact match and a straightforward access to the corresponding associated data.

Figure 3:
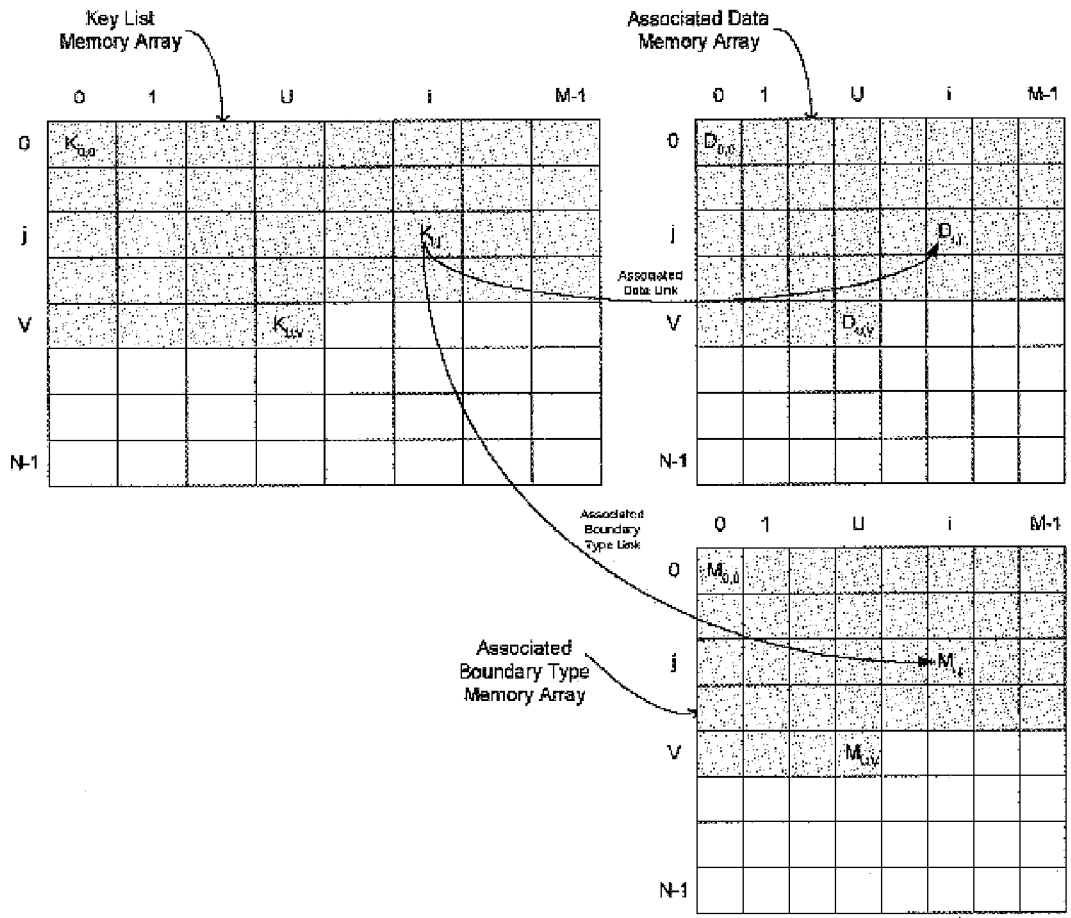
FIG. 3 is a schematic illustration of the correspondence between the 2-Dimensional key list, the associated data list and the associated boundary type list for an RCAM.

The RAM-Based RCAM includes additionally an Associated Boundary Type List, where each Associated Boundary Type entry $M_{i,j}$ corresponds to the key entry $K_{i,j}$ as shown in FIG. 3. The RCAM stores a list of key entries that represent boundaries of associative ranges, so that a key search results in a matching range, and the retrieval of the associated data and boundary type that corresponds uniquely to this range. The associated boundary type determines the validity of the matching range and the associated data.

The entries of the Key List, Associated Data List and Associated Boundary Type List (for an RCAM) are always kept in a compact and sequential form (monotonously increasing or decreasing), and perfect correspondence, by means of consistent Insert and Remove algorithms.

An Insert operation starts with a search for the location index of the key to be inserted in the Key List. In a Binary CAM, the key and the associated data having this index are then inserted in the Key List and the Associated Data List, respectively. In an RCAM, in addition, the associated boundary type entry having the same index is inserted in the Associated Boundary Type List.

Similarly, a Remove operation starts with a search for the location index of the key to be removed from the Key List. Then, the key and the associated data having this index are removed from the Binary CAM. In an RCAM, the associated boundary type entry having the same index is removed as well.

These principles must be preserved when the Binary CAM and the RCAM are implemented using multiple modules; that is, a key listed with a certain index in any module, must have a corresponding associated data entry (and also an associated boundary type entry for an RCAM) listed with the same index in the same module.

Multiple-module deployment while preserving these principles implies the ability to transfer, to an adjacent module, keys and their associated data (plus associated boundary type entries for RCAM systems) that are disposed in the boundary locations of each module, during both Insert and Remove operations:

Insert operation. When a key is inserted in a certain location in any module, all the keys having a larger value must be shifted one location forward. If the module is fully occupied, the highest-index key and the associated data corresponding to this key (along with the boundary type entry for an RCAM system) are shifted one location forward, which is the first location in the succeeding module.

Remove operation. When a key is deleted at a certain location in any module, all the keys having a larger value must be shifted one location backward. If the module is fully occupied, the highest-index key and the associated data corresponding to this key (along with the boundary type entry for an RCAM system) are replaced by a key and the associated data (along with the boundary type entry) shifted from the first location in the succeeding module.

The module operation depends on the condition of its adjacent modules. Therefore, each module must be continuously informed whether the adjacent modules are fully occupied or entirely empty.

The Key List, Associated Data List and Associated Boundary Type List (for an RCAM) are each implemented using partial modules containing a small number of rows. These modules are termed Key Modules, Associated Data Modules and Associated Boundary Type Modules. The Binary CAM (or RCAM) is thus broken down into the two types of modules (or three for the RCAM) defined above. The modules of the same type are integrated to form the Key List and the Associated Data List (and for the RCAM, the Associated Boundary Type List).

The modules of each type are arranged in sequence, so that, in reference to any module labeled $\zeta$, the preceding module ($\zeta-1$) contains smaller keys (i.e., keys having smaller values), whereas the succeeding module ($\zeta+1$) contains larger keys.

Figure 4:
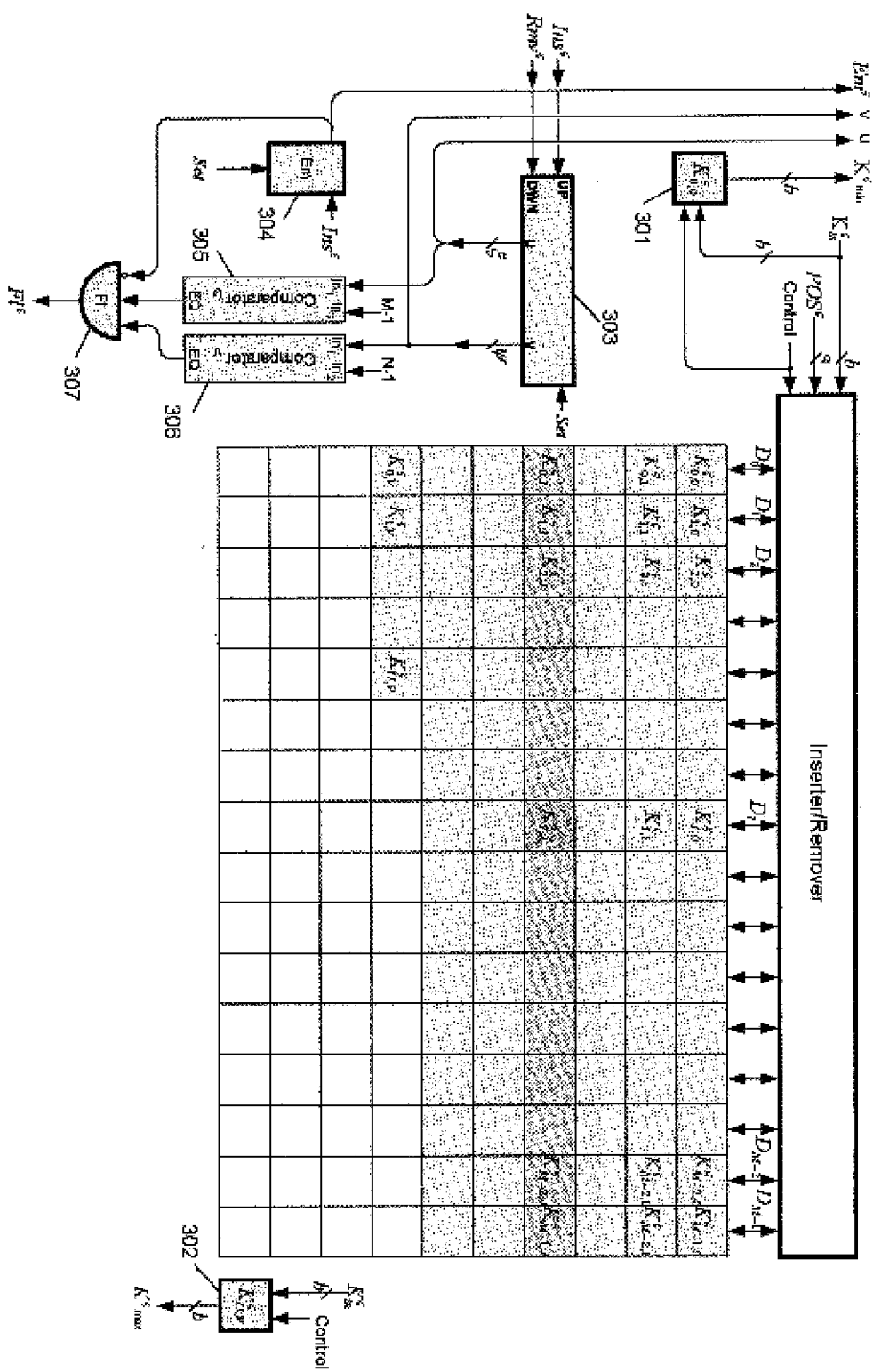
FIG. 4 shows essential components added to the $\zeta$-th key module.

FIG. 4 depicts the essential components added to the $\zeta$-th Key Module in the Binary CAM, according to the present invention. The components added to the Key Module are:

$K_{0,0}{}^\zeta$ Register: This register (301) holds $K_{0,0}{}^\zeta$, the first key in the module, as a separate, readily accessible value. The $K_{0,0}{}^\zeta$ value is available as the register output signal and is labeled $K_{min}{}^\zeta$ because it is the minimum key value stored in the $\zeta$-th module. $K_{min}{}^\zeta$ is used when performing a Remove operation in a preceding module (that holds smaller keys) and is loaded to the highest location in this module. The register value is updated during an Insert or Remove operation via the $K_{min}{}^\zeta$ line when the first row in the module is updated.

$K_{U,V}{}^\zeta$ Register: This register (302) holds $K_{U,V}{}^\zeta$, the last key in the module, as a separate, readily accessible value. The $K_{U,V}{}^\zeta$ value is available as the register output and labeled $K_{max}^\zeta$ because it is the maximum key value stored in the $\zeta$-th module. $K_{max}^\zeta$ is used when performing an Insert operation in this module, and is loaded to the first position of the succeeding module (that holds larger keys) whenever the $\zeta$-th module is full (U=M−1 and V=N−1). The register value is updated during an Insert or Remove operation via the $K_{in}^\zeta$ line when the V-th row in the module is updated.

Up/Down Counter: This counter (303) holds the location index of the current highest key in the module. After Reset, this counter holds an "All Ones" value. The first Insert operation actively performed in the module results in the counter wrap-around and in "All Zeros" state, pointing to row 0 and column 0 (U=0 and V=0). The $\zeta$ least significant output bits of the counter constitute the column index number U, whereas the $\psi$ most significant output bits constitute the row index number V.

$\xi − 1 < \log_2 M \leq \xi$, where M is the number of columns and $\xi$ is a positive integer, and $\psi − 1 < \log_2 N \leq \psi$, where N is the number of rows and $\psi$ is a positive integer.

The Up/Down Counter is increased by 1 when the Insert signal $Ins^\zeta$ is "1" and is decreased by 1 when the Remove signal $Rmv^\zeta$ is "1".

The Set signal is generated when the module is reset and the Up/Down counter is emptied. This happens when the Up/Down Counter is "All Zeros" and then $Rmv^\zeta$ becomes "1".

Em (Empty Flag) Flip-Flop: This flip-flop (304) indicates that the module is empty ($Em^\zeta$="1") when it is set to "1"; this takes place when the Set signal is "1". The flip-flop is reset to "0" when the first active Insert signal $Ins^\zeta$ becomes "1".

U and V Comparators: These pair of comparators (305 and 306) compare the index of the largest key (U,V) of the module with the index of the last position (M−1, N−1) of the module. If U=M−1 and V=N−1, the comparators indicate that the module is full.

Fl (Full) Gate: This AND gate (307) indicates that the module is full ($Fl^\zeta$="1") when the comparators show that the module is full and the Em flip-flop indicates that the module is not empty ($Em^\zeta$="0"). This last signal is necessary to rule out an $Fl^\zeta$="1" indication when the Up/Down Counter holds an "All Ones" value (after Reset) and yet the module is empty.

The input signals applied to the Key Module are:

The $Ins^\zeta$ signal is "1" whenever there is an Insert operation and the new key is inserted in this module or in any of the succeeding modules (that hold larger keys).

The $Rmv^\zeta$ signal is "1" whenever there is a Remove operation and the key is removed from this module or from any of the succeeding modules (that hold larger keys).

The $K_{in}^\zeta$ signal is applied to the $K_{0,0}^\zeta$ register during an Insert or Remove operation when the first row in the module is updated and to the $K_{U,V}^\zeta$ register when the last row value is updated.

Figure 5:
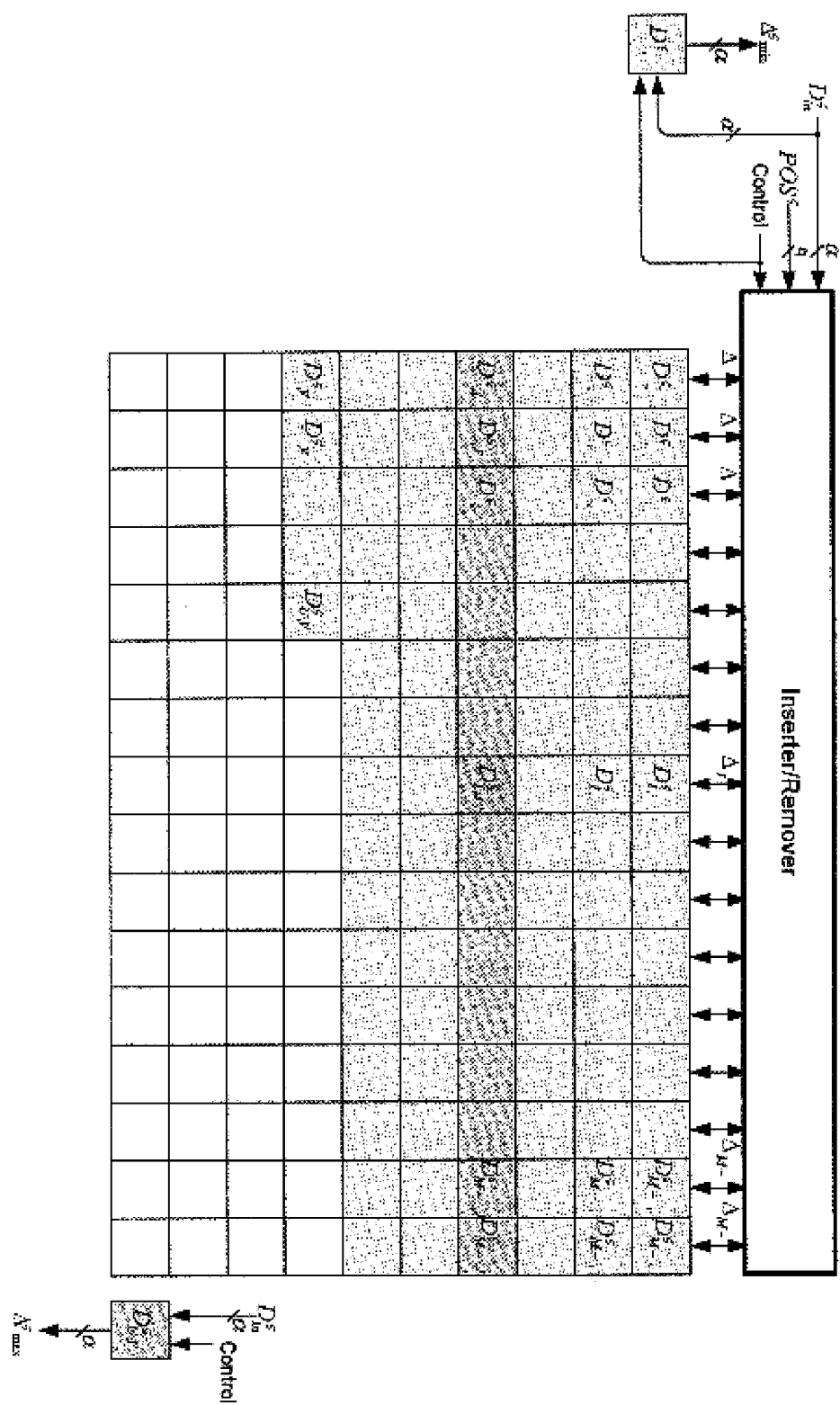
FIG. 5 shows essential components added to the $\zeta$-th associated data module.

FIG. 5 shows the essential components added to the $\zeta$-th Associated Data Module (and also to the $\zeta$-th Type List Module). Since the operations performed in this module correspond to those performed in the Key Module, it is synchronized and controlled by the same control signals as the Key Module. When the Key List inserts and deletes keys, the Associated Data List simultaneously inserts and deletes the corresponding associated data entries. Module chaining requires the boundary values to be readily available. These values are kept in two special registers:

$D_{0,0}^\zeta$ Register: This register holds the first key entry $D_{0,0}^\zeta$ in the Associated Data Module, as a separate, readily accessible value. The $D_{0,0}^\zeta$ value is available on the register output and is labeled $\Delta_{min}^\zeta$ because it is the minimum key value stored in the $\zeta$-th module. The $D_{0,0}^\zeta$ value ($\Delta_{min}^\zeta$) is used when performing a Remove operation in a preceding module (that holds smaller keys) and is loaded to the highest location of this module. The register value is updated during an Insert or Remove operation via the $D_{in}^\zeta$ line when the first row is updated.

$D_{U,V}^\zeta$ Register: This register holds the highest key entry $D_{U,V}^\zeta$ in the module, as a separate, readily accessible value. The $D_{U,V}^\zeta$ value is available on the register output and is labeled $\Delta_{max}^\zeta$ because it is the maximum key value stored in the $\zeta$-th module. The $D_{U,V}^\zeta$ value ($\Delta_{max}^\zeta$) is used when performing an Insert operation in this module, and is loaded to the first position of the succeeding module (that holds larger keys) whenever the $\zeta$-th module is full (U=M−1 and V=N−1). The register value is updated during an Insert or Remove operation via the $D_{in}^\zeta$ line when the V-th row in the module is updated.

The Associated Boundary Type Module (in the Associated Boundary Type List of an RCAM) is substantially identical to the Associated Data Module and may be understood by referring to FIG. 5 and to the associated description provided hereinabove.

Multi-Module Binary CAM and RCAM Architectures

A Binary CAM contains two arrays or lists, a Key List and an Associated Data List, each array consisting of P modules designated Key Modules and Associated Data Modules, respectively, as described hereinabove. An RCAM contains, additionally, P modules designated Associated Boundary Type Modules. Alternatively, the Associated Boundary Type data can be stored within the Key Modules or within the Associated Data Modules, as disclosed in my co-pending, unpublished PCT Patent Application Serial No. IL01/01025.

Each Key List, Associated Data List and Associated Boundary Type List is a 2-dimensional array having M columns and N rows.

The total amount of Key List entries in the CAM (or RCAM) is:

$$C = P \cdot M \cdot N$$

where C is defined as the CAM capacity.

Figure 6:
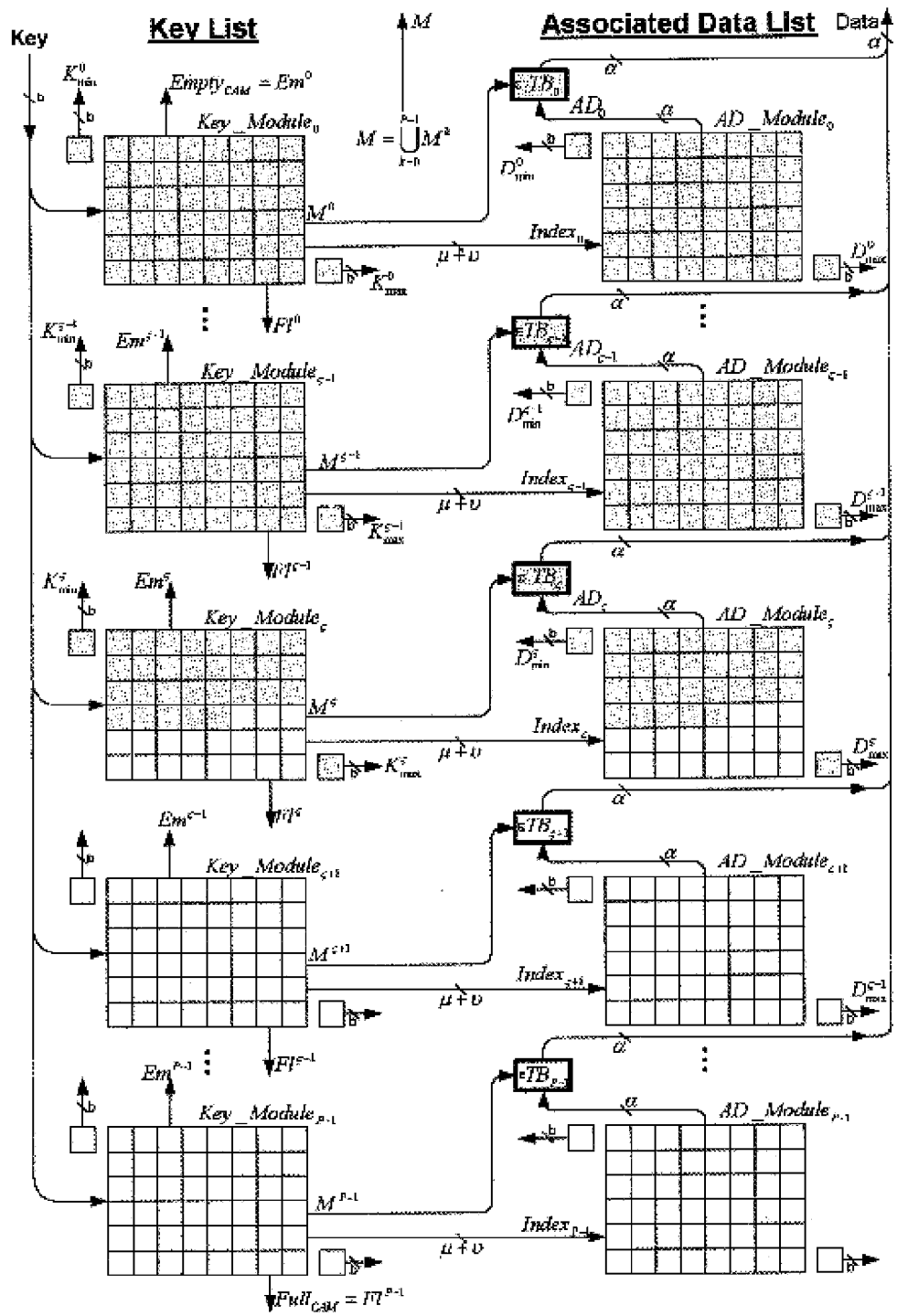
FIG. 6 shows the structuring of a binary CAM from multiple modules.
Figure 7:
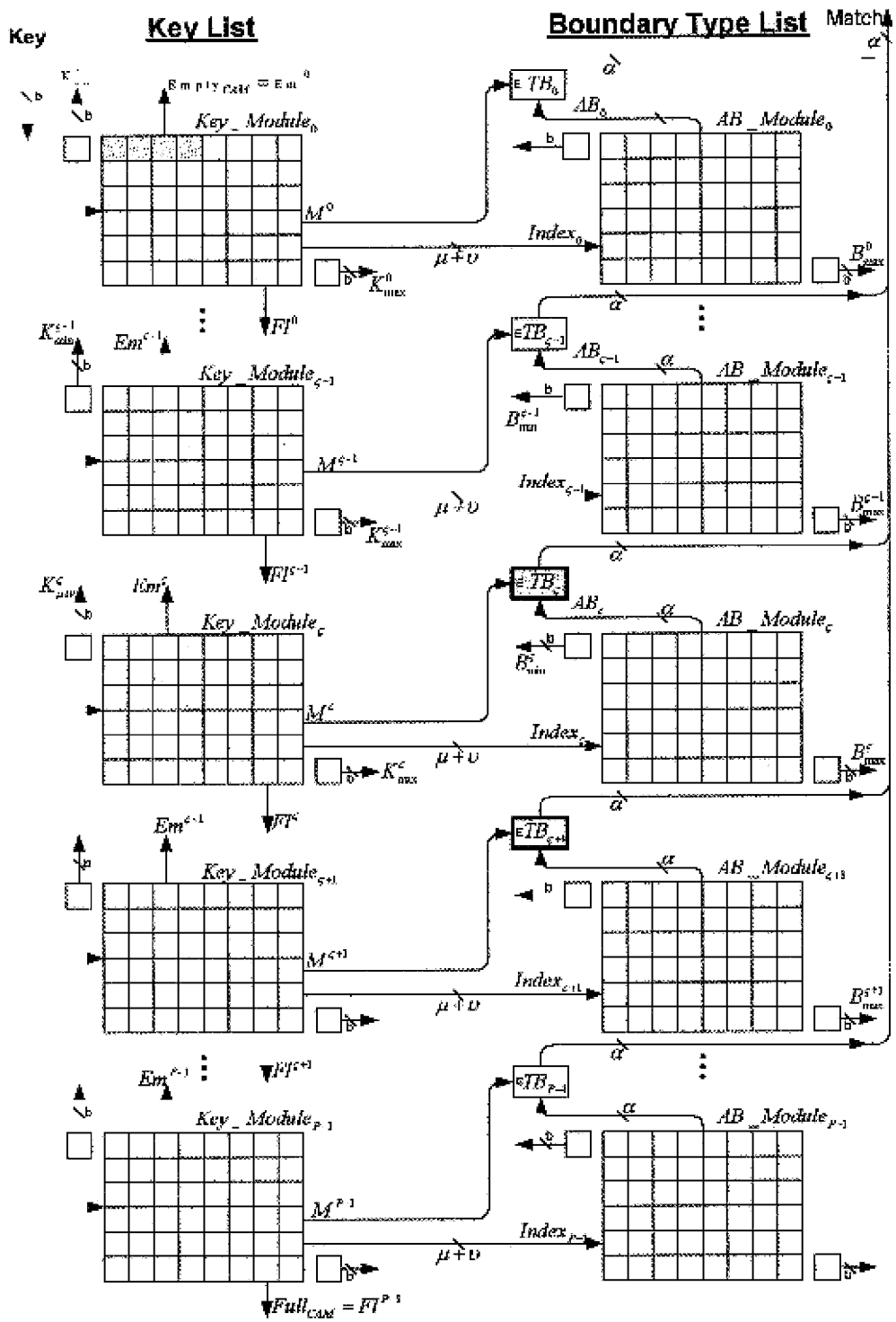
FIG. 7 shows the structuring of an RCAM with additional associated boundary type modules.
Figure 8:
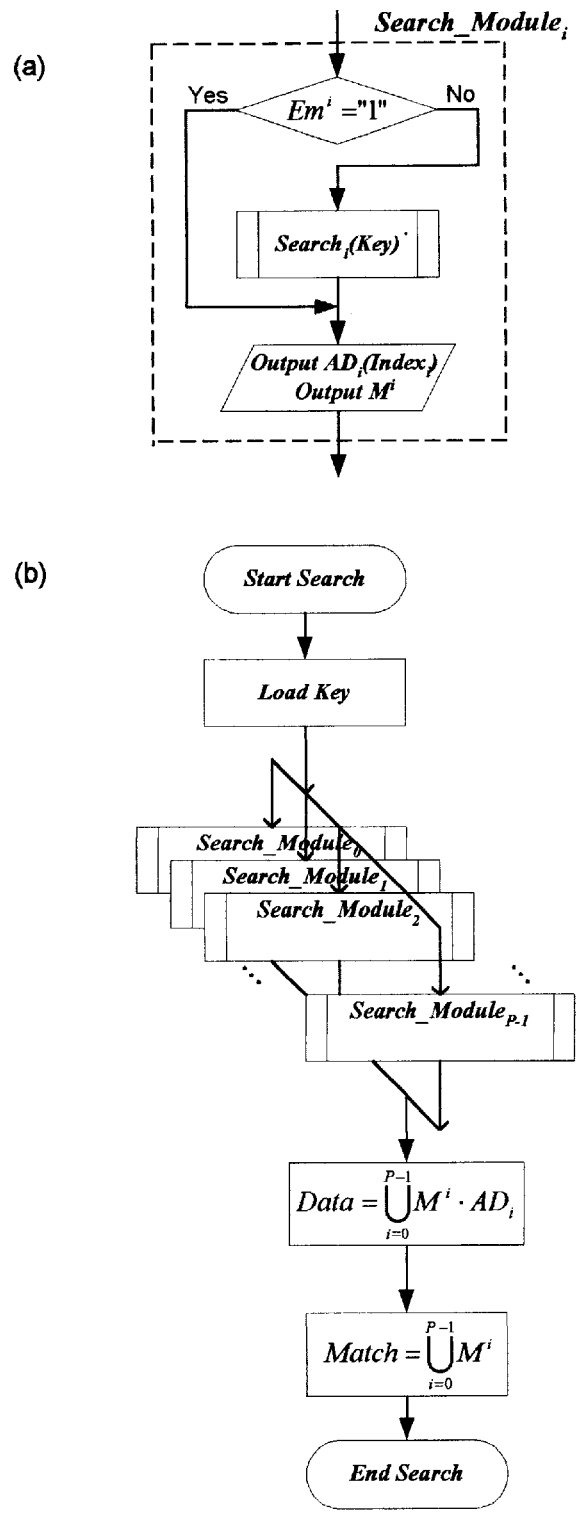
FIG. 8a is a search algorithm flowchart for a single module in a binary CAM.
FIG. 8b is a search algorithm flowchart for multiple modules in a binary CAM of the present invention, in which the search procedure is performed concurrently on all the modules.
Figure 9:
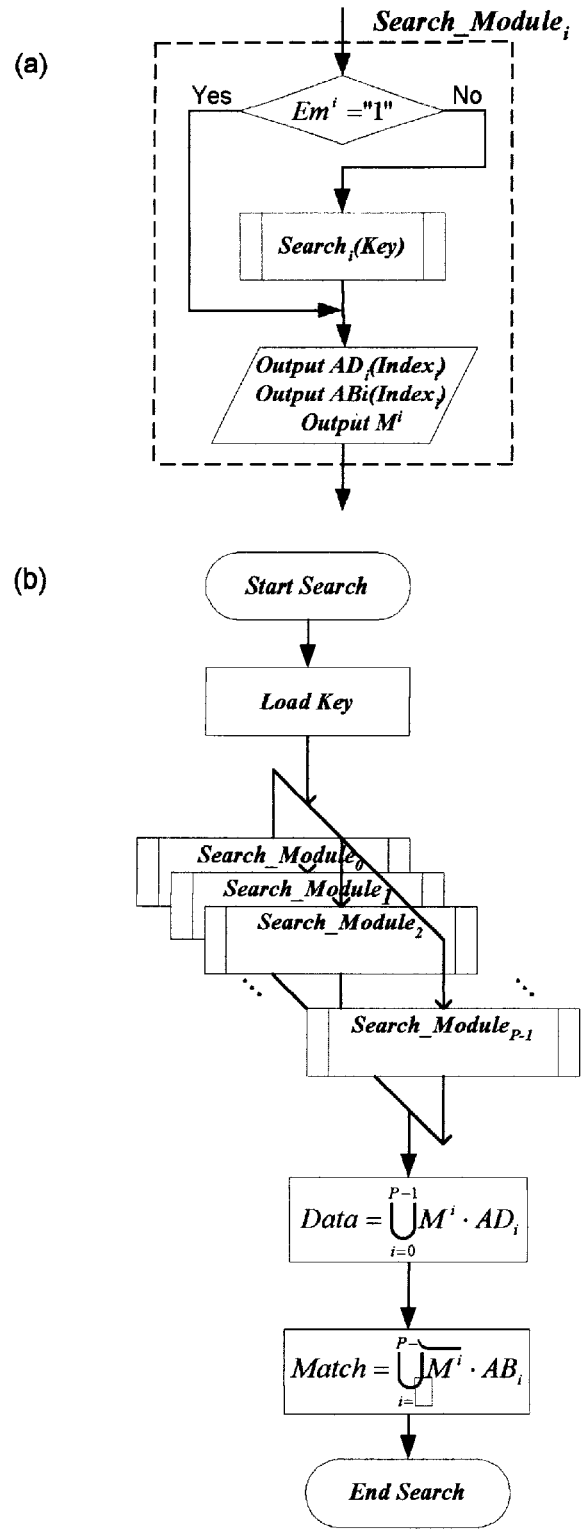
FIG. 9a is a search algorithm flowchart for a single module in an RCAM.
FIG. 9b is a search algorithm flowchart for multiple modules in an RCAM of the present invention, in which the search procedure is performed concurrently on all the modules.
Figure 10:
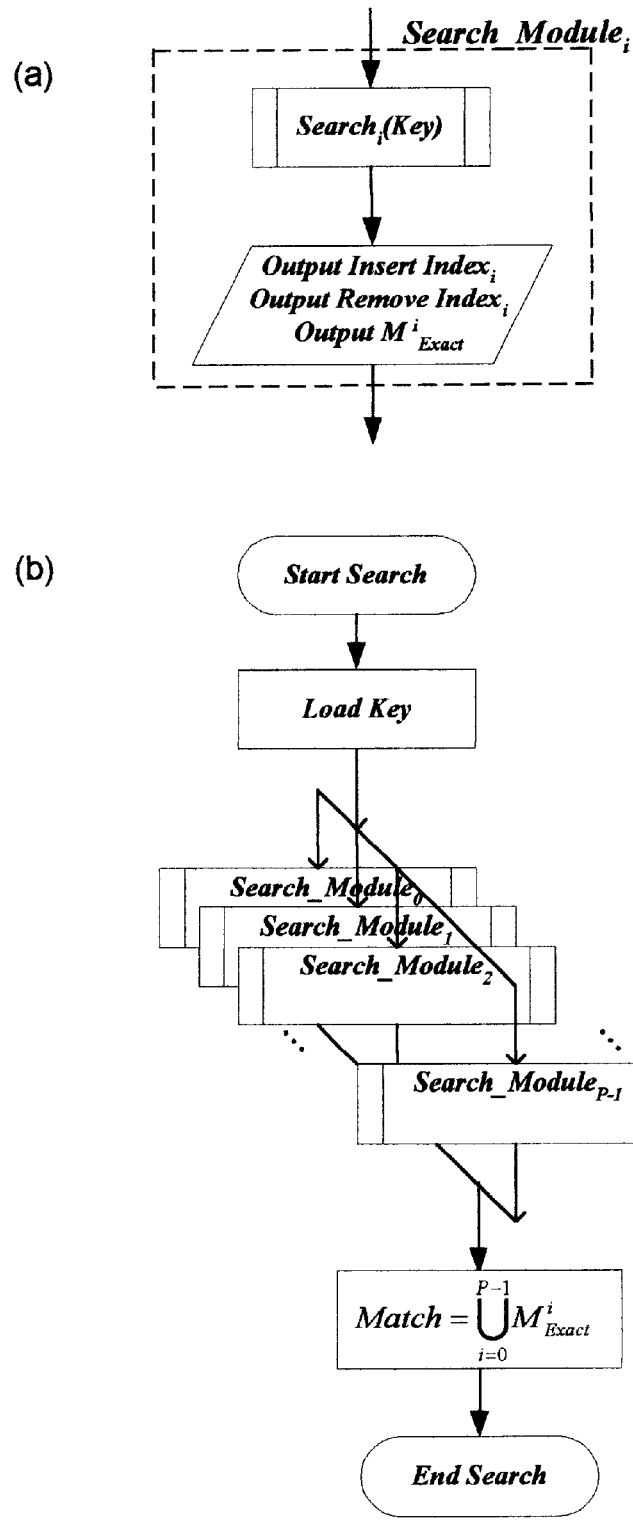
FIG. 10a is a flowchart for the search algorithm preceding an insert or remove procedure for a single module in a binary CAM or RCAM.
FIG. 10b is a flowchart for the search algorithm preceding an insert or remove procedure for a multiple-moduled binary CAM or RCAM of the present invention, in which the search procedure is performed concurrently on all the modules.
Figure 11:
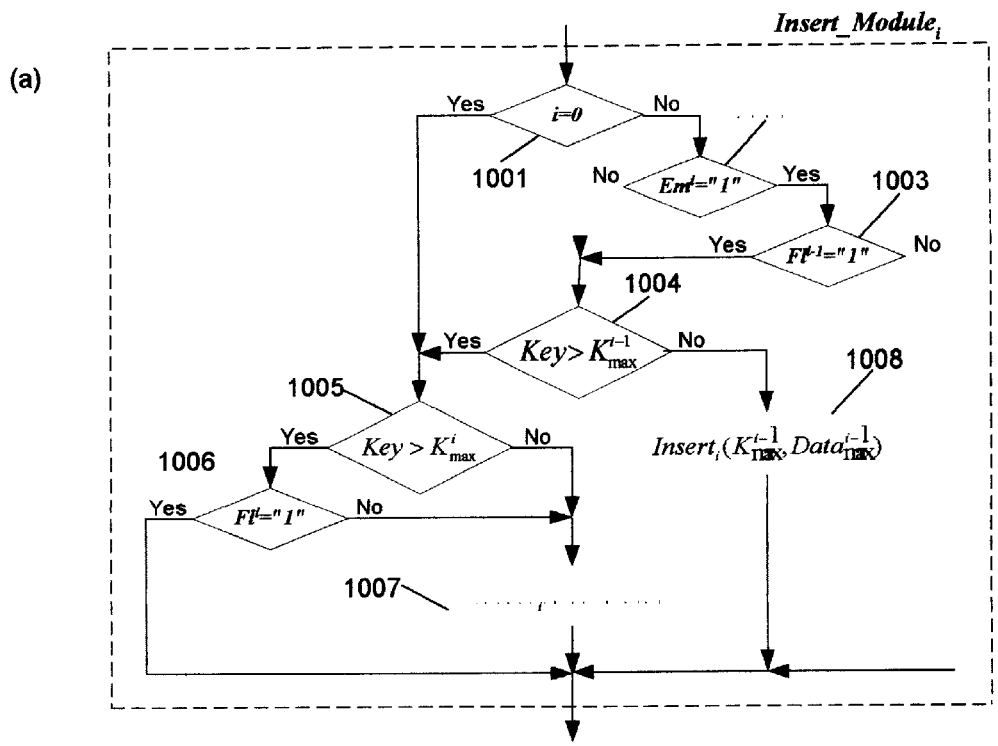
FIG. 11a is a flowchart of the insert algorithm for a single module in a binary CAM or RCAM.
FIG. 11b is a flowchart of the insert algorithm for a multiple-moduled binary CAM or RCAM of the present invention, in which the insert procedure is performed concurrently on all the modules.
Figure 11:
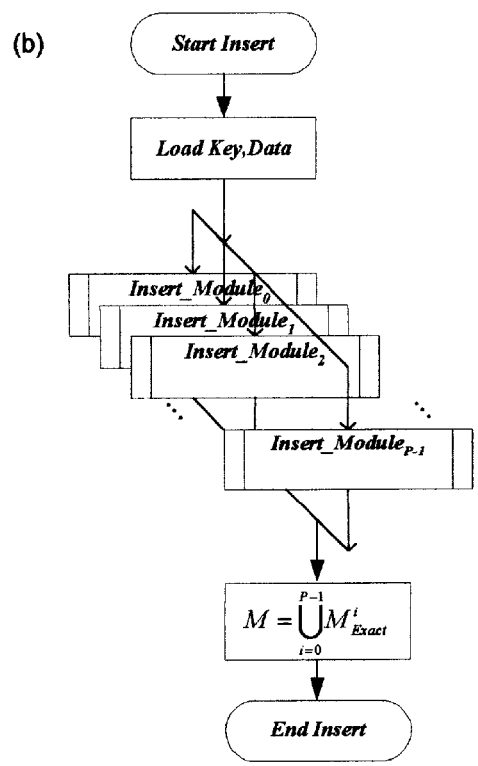
Figure 12:
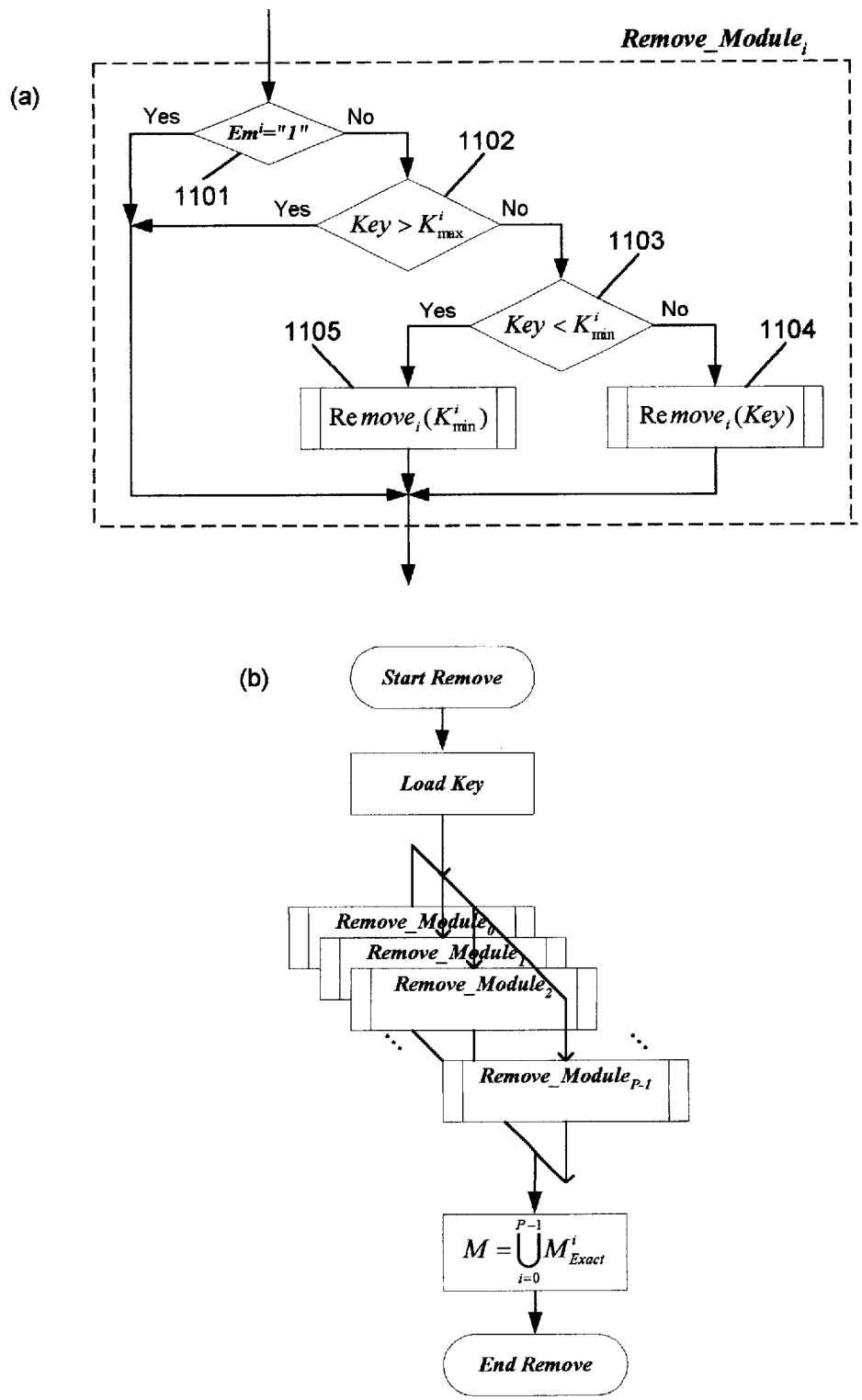
FIG. 12a is a flowchart of the remove algorithm for a single module in a binary CAM or RCAM.
FIG. 12b is a flowchart of the remove algorithm for a multiple-moduled binary CAM or RCAM of the present invention, in which the insert procedure is performed concurrently on all the modules.

FIG. 6 illustrates how to structure a Binary CAM from multiple Key and Associated Data Modules. An RCAM is structured in a similar way with additional Associated Boundary Type Modules that are identical and connected in parallel to the Associated Data Modules). The Associated Boundary Type Modules are shown in FIG. 7.

The added components required for each Binary CAM (or RCAM) module to enable this module to perform Search, Insert and Remove operations in an independent fashion and concurrently with the other modules are described in conjunction with FIGS. 8–12 hereinbelow.

Each module $\zeta$ in the Key List (excluding Key_Module$_0$) receives as inputs the maximum value stored in the preceding module ($\zeta$−1), $K_{max}^{\zeta-1}$ and the signal $Fl^{\zeta-1}$ that indicates whether this module is full. Each module $\zeta$ (excluding Key_Module$_{P-1}$) also receives the minimum key value stored in the succeeding module ($\zeta$+1), $K_{min}^{\zeta-1}$, and the signal $Em^{\zeta+1}$ that indicates whether this module is empty.

The $Fl^{P-1}$ signal of the last module (which holds the largest keys) also indicates whether the last module is full. If the last module is full, then all the CAM entries are occupied and the entire CAM is full:

$$Full_{CAM} = Fl^{P-1}$$

The $Em^0$ signal of the first module (which holds the smallest keys) indicates whether this first module is empty. If the first module is empty, then the entire CAM is empty.

$$Empty_{CAM} = Em^0$$

Each module $\zeta$ in the Associated Data List (except for $AD\_Module_0$) receives the last value stored in the preceding module ($\zeta-1$), $D_{max}^{\zeta-1}$. Each module $\zeta$ (excluding $AD\_Module_{P-1}$) also receives the minimum associated data value stored in the succeeding module ($\zeta+1$), $D_{min}^{\zeta+1}$.

In an RCAM, each module $\zeta$ in the Associated Boundary Type List (except for $AB\_Module_0$) receives the last value stored in the preceding module ($\zeta-1$), $M_{max}^{\zeta-1}$. Each module $\zeta$ (excluding $AB\_Module_{P-1}$) also receives the minimum boundary type value stored in the succeeding module ($\zeta+1$), $M_{min}^{\zeta+1}$.

Whenever a submitted key is searched in the entire Binary CAM or RCAM, each module in the Key List performs its Search operation independently and concurrently with the other modules. The Search operation starts by comparing the submitted key with the first and last key entries of each Key Module, and then proceeds to search within the specific module that may include the submitted key. If the searched key is listed in the Binary CAM or is contained in a range in the RCAM, it will only be found in one module, say the i-th module, and only this module will issue a match signal $M^i = $"1" ($0 \leq i \leq P-1$) and the location index of the searched key.

The location index is used to retrieve the respective associated data from module $AD\_Module_k$ in the Associated Data List. This data is sent to the corresponding Tristate Buffer $TB_i$. The $TB_i$ buffer output is enabled by the respective match signal $M^i$. Since the match signal of only one module is active, only one Tristate buffer output is enabled on the Data bus and issues the respective associated data. If there is no match, none of the modules will issue a match signal.

The Binary CAM (or RCAM) provides the associated data that corresponds to the searched key according to the following formula:

$$Data = \bigcup_{i=0}^{P-1} M^i \cdot AD_i$$

In a Binary CAM, the match signal is given by the following formula:

$$Match_{CAM} = \bigcup_{i=0}^{P-1} M^i$$

In an RCAM, the boundary type entry is obtained in a procedure similar to that used for getting the associated data. The location index issued by the k-th module where the searched key is found is used to retrieve the boundary type from module $AB\_Module_i$ in the Associated Data List. The respective Tristate Buffer TBi, enabled by the match signal $M^i$, issues the corresponding boundary type entry.

The RCAM match signal provides the boundary type that corresponds to the searched key according to the following formula:

$$Match_{CAM} = \bigcup_{i=0}^{P-1} M^i \cdot AB_i$$

Thus, the RCAM match signal depends on the boundary type, which determines the validity of the range that contains the searched key. (The main properties and operations of key ranges have been described in my co-pending, unpublished PCT Patent Application Serial No. IL01/01025).

If $Match_{CAM}=$"0" or $Match_{RCAM}=$"0" (no match), the associated data of the Binary CAM or RCAM has no meaning. In this case, the Data output is tristated.

FIG. 8a and FIG. 9a show flowcharts of Search algorithms for a single i-th module in a Binary CAM and an RCAM, respectively.

The i-th Key Module is first checked for emptiness. If it is empty ($Em^i=$"1"), the Search is terminated except for handling the output of the match signal Mi and the associated data.

If the module is not empty, a search is performed as described, for the Binary CAM, in my co-pending, unpublished PCT Patent Application Serial No. IL01/00458. If the Search operation is successful, it results in a match, $M^i=$"1", which indicates a meaningful associated data value $AD_i$ in the Associated Data Module. For the RCAM, a successful search also yields a meaningful boundary type value $AB_i$. This search is described in detail in my co-pending, as yet unpublished U.S. patent application Ser. No. 09/779,941, which is incorporated by reference for all purposes as if fully set forth herein.

The Search operation in the i-th module is completed with the output of the $M^i$, $AD_i$ and $AB_i$ values.

FIG. 8b shows the search performed concurrently in all the P modules of the Binary CAM using the algorithm depicted in FIG. 8a. The Data and Match signals correspond to those of the individual module that contains the searched key. They are obtained by summing up the results of the Search operation performed in all the modules according to the following formulas:

$$Data = \bigcup_{i=0}^{P-1} M^i \cdot AD_i$$

$$Match_{CAM} = \bigcup_{i=0}^{P-1} M^i$$

FIG. 9b shows the search performed concurrently in all the P modules of the RCAM using the algorithm depicted in FIG. 9a. In an RCAM, the Data signal is obtained in the same way as for the Binary CAM. However, the Match signal corresponds to the boundary type of the individual module that contains the searched key, and is obtained using the following sum-up formula:

$$Match_{RCAM} = \bigcup_{i=0}^{P-1} M^i \cdot AB_i$$

Prior to the key insertion/removal, a Search procedure is performed independently and concurrently in all the Key Modules. The Search procedure starts by comparing the submitted key with the first and last key entries of each Key Module, and then proceeds to search within the specific module that may include the submitted key. The Search procedure determines the position index of the submitted key to be inserted or removed, provided that these operations are allowed. Key insertion is allowed only if the key is not included in the i-th Key Module, whereas key removal is possible only if it is already included in the module ($M_{Exact}$="1").

FIG. 10a shows the flowchart for the Search algorithm for a single i-th module in a Binary CAM or an RCAM. This algorithm is not performed independently but as a part of the Insert or Remove operation.

If the Search operation precedes an Insert operation and is successful, it provides the position index for the key insertion, and issues the signal $M_{Exact}$="0", which indicates that the submitted key was not previously included in the i-th module. If the Search operation preceding a Remove operation is successful, it provides the position index for the key removal, and issues the signal $M_{Exact}$="1", which indicates that the submitted key was already included in the i-th module.

FIG. 10b shows the search performed concurrently in all the P modules of the Binary CAM or RCAM using the algorithm depicted in FIG. 10a. The overall Match signal is obtained by summing-up the results of the Search operation performed in all the modules according to the following formulas:

$$\text{Match} = \bigcup_{i=0}^{P-1} M_{Exact}^i$$

A successful Insert operation can only take place in Match="0", meaning that that the submitted key was not previously included in the entire Binary CAM or RCAM. On the other hand, a successful Remove operation must result in Match="1", which indicates that the submitted key was already included.

FIG. 11a shows the flowchart for the Insert operation for a single i-th module in the Binary CAM or RCAM.

The first module (i=0) (1001) does not have a preceding module, so that the respective Insert operation circumvents all the steps dealing with the preceding module. However, the first module is usually implemented in the same way as all the succeeding modules by defining the nonexistent preceding module (i=−1) to be full with zeros, so that $Fl^{-1}$="1", $Em^{-1}$="0" and $K_{max}^{-1}$=0. Then, the Insert algorithm shown in FIG. 11a can be simplified, because it does not have to deal separately with the first module.

The key inserted in any i-th module for i>0 (succeeding the first module) may be either the submitted key (as described in my PCT Patent Application Serial No. IL01/00458), or, alternatively, the largest key in the preceding module (i−1), $K_{max}^{i-1}$.

The Insert algorithm first checks whether key insertion is relevant for the i-th module. If this module is empty ($Em^i$="1") (1002) and the preceding module (i−1) is not full ($Fl^{i-1}$="0") (1003), then the submitted key can only be inserted (if at all) in the preceding module. Assuming that the i-th module is not empty ($Em^i$="0") or that the preceding module is full ($Fl^i$="1"), the submitted key may be inserted in the i-th module provided that it is larger than the highest key value in the preceding module (Key>$K_{max}^{i-1}$) (1004) but smaller than the highest key value in the i-th module (Key<$K_{max}^{i-1}$) (1005). If the i-th module is full ($Fl^i$="1") (1006), then, after the insertion, its largest key $K_{max}^i$ will be shifted out of this module and inserted in the lowest location (0,0) of the succeeding module (i+1). If the i-th module is not full ($Fl^i$="0"), then the submitted key will be inserted here (1007) even if it is larger than its highest key value (Key>$K_{max}^i$). Note that the submitted key can be inserted in the i-th module only if the previous Insert location search results in $M_{Exact}^i$="0" (no exact match), meaning that the key is not included in this module; otherwise, the Insert operation will not be executed. This search procedure is part of the Insert algorithm.

If the submitted key is smaller than the largest key in the preceding module (Key<$K_{max}^{i-1}$) (in step 1004) and the preceding module is full ($Fl^{i-1}$="1") (in step 1003), then the submitted key will be inserted in the preceding module and $K_{max}^{i-1}$ will be shifted out and inserted in the lowest location (0,0) of the i-th module (1008).

The Insert operation can take place if and only if $Match_{CAM}$="0", meaning that the key to be inserted is not included in the Key List. If the Search operation results in $Match_{CAM}$="1", then the key to be inserted is already included in the Key List, the insertion attempt is considered an error and the Insert operation will not be executed.

FIG. 11b shows the Insert operation performed concurrently in all the modules of the Binary CAM or RCAM using the algorithm depicted in FIG. 11a.

The Insert time is approximately $$t_E \approx 2 \cdot (N_m+1) \cdot T + t_S$$

where $N_m$ is the number of rows in a single module.

It can be seen that $$t_E << 2 \cdot (P \cdot N_m+1) \cdot T + t_S$$

which is the Insert execution time for a Binary CAM implemented using one undivided array.

FIG. 12a shows the flowchart for the Remove operation for a single i-th module in the Binary CAM or RCAM.

The key removed from the i-th module may be either the submitted key (as described in my PCT Patent Application Serial No. IL01/00458), or alternatively the smallest key in the module, $K_{min}^i$.

The Remove algorithm first checks whether key removal is relevant for the i-th module. The Remove operation is possible only if the module is not empty ($Em^i$="0") (step 1101). If the submitted key lies between the lowest and highest key values stored in the i-th module ($K_{min}^i$<Key≦$K_{max}^i$) (steps 1102 and 1103), it will be removed from the module (step 1104).

If the submitted key is larger than the highest key value (Key>$K_{max}^i$), it can only be removed (if at all) from the succeeding module. Note that the submitted key can be removed from the i-th module only if the previous Remove location search results in $M_{Exact}^i$="1" (exact match), meaning that the key is included in this module; otherwise, the Remove operation will not be executed. This search procedure is part of the Remove algorithm.

If the submitted key is smaller than the lowest value stored in the i-th module (Key<$K_{min}^i$) in step 1103, then the submitted key will be removed from the preceding module (i−1) and $K_{min}^i$ will be removed from the i-th module and shifted to the highest location (M−1, N−1) in the preceding module (step 1105).

A Remove operation can take place if and only if $M_{CAM}$="1", meaning that the key to be removed is included in the Key List. If the Search operation results in $M_{CAM}$="0", then the key to be removed is not included in the Key List, the removal attempt is considered an error, and the Remove operation will not be executed.

FIG. 12b shows the Remove operation performed concurrently in all the modules of the Binary CAM or RCAM using the algorithm depicted in FIG. 12a. The Remove execution time is approximately:

$$t_R \cong 2 \cdot (N_m+1) \cdot T + t_S$$

where $N_m$ is the number of rows in a single module.
It can be seen that $$t_R << 2 \cdot (P \cdot N_m+1) \cdot T + t_S$$

which is the Remove execution time for a Binary CAM implemented using one undivided array.

The associated data corresponding to a key included in the Key List can be modified using an Insert operation. However, this is better performed by means of an explicit Update command that states that the key is already listed and must be updated. This command is preferable because it takes only one or two clock cycles on top of the previous Search operation, as compared to the Insert operation, which takes much longer.

In an RCAM, the Update command is used to modify the Associated Data List and the Associated Boundary Type List for a specific key in the Key List, without changing the number of keys in the Key List. This operation is generally necessary when an overlapping range (for example, an IPv4 CIDR Address) is inserted in or removed from the RCAM. A special algorithm determines whether it is necessary to insert or remove one or more keys, and also whether the boundary type and the associated data entries corresponding to the keys change as a consequence. Usually, the potential insertion or removal of keys following the insertion or removal of an overlapping range is accompanied by the update of the corresponding boundary type and associated data entries.

As used herein in the specification and in the claims section that follows, the term "module value span" refers to a span or stretch of values in a key module. The module value span is bounded by keys having "extreme values". Thus, for a module containing 9 keys having the values of 3, 7, 38, 47, 88, 89, 93, 102, and 114, the module value span is from 3 to 114, and the extreme values of the keys in the module are 3 and 114.

As used herein in the specification and in the claims section that follows, the term "monotonic order" and the like, in relation to a single key module, refer to one or more rows in an array in which the key values are in ascending order or in descending order.

As used herein in the specification and in the claims section that follows, the term "row" refers to a first line of cells in an array, and the term "column" refers to a second line of cells in an array, the second line of cells being disposed in perpendicular fashion to the first line of cells. For the sake of convenience, all rows in the Figures are horizontal, and all the columns are vertical.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A multiple module device for storing arranged data in a memory, and for extracting the data therefrom, the device comprising:
   (a) a memory having a plurality of module pairs, each of said module pairs having:
      (i) a key module including a first array of cells, said first array having at least two dimensions and having rows and columns, said first for array containing a plurality of keys, each of said cells having a unique address and being accessible via an input key, said keys within each of said key modules being arranged in monotonic order, and
      (ii) an associated data module including a second array of cells, said second array having at least two dimensions and having rows and columns, said second array having a plurality of data entries, associated with said keys,
   wherein said memory is designed and configured such that each of said data entries is associated with a particular one of said keys, and
   (b) processing means designed and configured to search, in response to said input key, said plurality of keys within each said key module, so as to identify a match.

2. The multiple module device of claim 1, wherein said keys within each said key module define a module value span, and wherein said first modules are arranged in monotonic order with respect to each said module value span.

3. The multiple module device of claim 2, further comprising:
   (c) sorting means for arranging said keys in monotonic order within said first array.

4. The multiple module device of claim 1, wherein each of said associated data entries has a unique pair of row and column indices for association with a unique pair of row and column indices of a particular one of said keys.

5. The multiple module device of claim 1, wherein said keys represent range boundary information.

6. The multiple module device of claim 5, further including range validity information for each of said range boundary information, said range validity information stored within said memory.

7. The device of claim 6, wherein said range boundary information is a single range-boundary value.

8. The device of claim 7, wherein each said range validity information is disposed in said first array, each said range validity information corresponding to a particular said single range-boundary value.

9. The device of claim 7, wherein said range validity information is stored in a separate array.

10. The device of claim 7, wherein each said range validity information is disposed in said second array, each said range validity information corresponding to a particular one of said associated data entries.

11. The device of claim 2, wherein each said key module includes a first register for holding a first key and a second register for holding a last key, said first key and said last key representing extreme values of said module value span, said first register and said second register being designed and configured to produce register output signals.

12. The device of claim 2, wherein each said key module includes at least one comparator for comparing an index of a key having an extreme value of said module value span with an index of a key disposed in a last position of said key module.

13. The device of claim 2, wherein said processing means include:
   i) a row locator containing at least a first comparator, for comparing contents of an end column of said first array with said input key.

14. The device of claim 13, wherein said processing means further include:
   ii) a column locator containing at least a second comparator, for comparing contents of said row with said input key.

15. The multiple module device of claim 1, wherein each of said module pairs further includes:
   (iii) a tristate buffer operatively connected to said key module and to said associated data module.

16. The multiple module device of claim 6, wherein each of said module pairs further includes an associated boundary type module.

17. The multiple module device of claim 6, wherein said associated boundary type module is operatively connected to a tristate buffer.

18. The multiple module device of claim 15, wherein an output of said tristate buffer is enabled by a match signal received from said key module.

19. A method for arranging and storing data in a memory and for extracting the data from the memory in response to an input key, the method comprising the steps of:
   (a) providing a device including:
      (i) a memory having a plurality of module pairs, each of said module pairs having:
         (A) a key module including a first array of cells, said first array having at least two dimensions and having rows and columns, said first array for containing a plurality of keys, each of said cells having a unique address and being accessible via an input key, said keys within each of said key modules being arranged in monotonic order, and
         (B) an associated data module including a second array of cells, said second array having at least two dimensions and having rows and columns, said second array having a plurality of data entries, associated with said keys,
      wherein said memory is designed and configured such that each of said data entries is associated with a particular one of said keys, and
      (ii) processing means, and
   (b) performing a processing operation, using said processing means on each said key module in parallel.

20. The method of claim 19, wherein each of said plurality of keys includes range boundary information.

21. The method of claim 19, wherein said device further includes an associated boundary type module including a third array of cells, said third array having at least two dimensions, and a plurality of data entries containing range validity information, each of said data entries associated with a particular one of said keys.

22. The method of claim 20, wherein said range boundary information is a single range-boundary value.

23. The method of claim 19, wherein said processing operation is a Search operation.

24. The method of claim 19, wherein said processing operation is an Insert operation.

25. The method of claim 19, wherein said processing operation is a Remove operation.

26. The method of claim 19, wherein said processing operation is an Update operation.

27. The method of claim 19, wherein said processing operation includes a comparing operation.

28. The method of claim 19, wherein each of said plurality of keys includes range boundary information, and wherein said comparing operation includes comparing a value of said input key with said range boundary information to determine a particular range to which said input key belongs.

29. The method of claim 28, wherein a row or column containing said range boundary information is selected by the following steps:
   (i) performing a comparison between said range boundary information and said input key to produce a result, and
   (ii) identifying a row or column in which said result undergoes a change in inequality status.

30. The method of claim 29, further comprising the step of:
   (iii) selecting said row or column.

31. The method of claim 24, further comprising the steps of:
   (c) identifying within a particular key module of said key modules, a row into which a new key should be inserted and selecting said row, and
   (d) inserting said new key into an insertion location in said particular key module while maintaining said monotonic order within each of said key modules.

32. The method of claim 31, wherein said identifying in step (c) includes a comparison of said new key with at least one end key of said plurality of keys, said end key disposed in an end column in said particular key module.

33. The method of claim 31, wherein said identifying in step (c) includes examining all said key modules in parallel.

34. The method of claim 31, further comprising the step of:
   (e) checking, before step (d), that said particular key module is devoid of a key of identical value to said new key.

35. The method of claim 31, further comprising the step of:
   (e) identifying a column index for said new range boundary value by performing a comparison of said new range boundary value with said range boundary information disposed in said row.

36. The method of claim 31, wherein said maintaining of said monotonic order is achieved by shifting a content of each cell disposed after said insertion location respectively, by one position, thereby completely filling at least a portion of said first array with said keys.

37. The method of claim 31, wherein data associated with said new key is inserted into said associated data module of said module pair containing said particular key module.

38. The method of claim 24, further comprising the steps of:
   (c) identifying within a particular key module of said key modules, a row containing a key for inserting, and selecting said row, and
   (d) inserting said key for inserting from an insertion location in said particular key module while maintaining said monotonic order within each of said key modules.

39. The method of claim 25, further comprising the steps of:
   (c) identifying within a particular key module of said key modules, a key for removing, and selecting said row, and (d) removing said key for removing from a removal location in said particular key module while maintaining said monotonic order within each of said key modules.

40. The method of claim 19, wherein said performing a processing operation includes a match/no-match step performed on each said key module in parallel, in which said input key is compared with said keys in each said key module.

41. The method of claim 19, wherein said performing a processing operation includes:

holding as distinct, readily accessible values, a first key and a last key disposed in said key module.

42. The method of claim 19, wherein said performing a processing operation includes:

receiving an input signal indicating that an Insert/Remove operation is taking place in an adjacent module.

43. The method of claim 19, wherein said performing a processing operation includes:

holding a location index of a current highest key in said key module, and indicating a state of said key module as being full or empty.

\* \* \* \* \*